United States Patent [19]

Lauer

[11] Patent Number: 4,675,646
[45] Date of Patent: Jun. 23, 1987

[54] RAM BASED MULTIPLE BREAKPOINT LOGIC

[75] Inventor: Gilbert E. Lauer, San Jose, Calif.

[73] Assignee: Tandem Computers Incorporated, Cupertino, Calif.

[21] Appl. No.: 537,039

[22] Filed: Sep. 29, 1983

[51] Int. Cl.[4] .................... G05B 1/00; G06F 7/02
[52] U.S. Cl. ........................... 340/146.2; 364/900; 371/57; 371/16; 371/19
[58] Field of Search ... 364/200 MS File, 900 MS File; 340/146.2; 371/57, 16, 19, 24-26

[56] References Cited

U.S. PATENT DOCUMENTS

| | | | |
|---|---|---|---|
| 3,937,938 | 2/1976 | Matthews | 364/200 |
| 4,080,650 | 3/1978 | Beckett | 364/200 |
| 4,100,532 | 7/1978 | Farnbach | 340/146.2 |
| 4,176,394 | 11/1979 | Kaminski et al. | 364/200 |
| 4,293,950 | 10/1981 | Shimizu et al. | 371/27 |
| 4,312,071 | 1/1982 | Bloch | 371/57 |
| 4,339,819 | 7/1982 | Jacobson | 364/200 |
| 4,426,699 | 1/1984 | Tanaka et al. | 371/57 |
| 4,475,237 | 10/1984 | Glasby | 340/146.2 |
| 4,635,193 | 1/1987 | Moyer et al. | 364/200 |

Primary Examiner—Archie E. Williams, Jr.
Assistant Examiner—Dale M. Shaw
Attorney, Agent, or Firm—Townsend and Townsend

[57] ABSTRACT

An electronic circuit for the generation of multiple breakpoint interrupts uses a plurality of RAMs (random access memory) wherein are stored bits such that, if all of the bit outputs of the RAM are active, then a breakpoint has been recognized. The logical combination of the RAM outputs determines the presence of a breakpoint.

7 Claims, 1 Drawing Figure

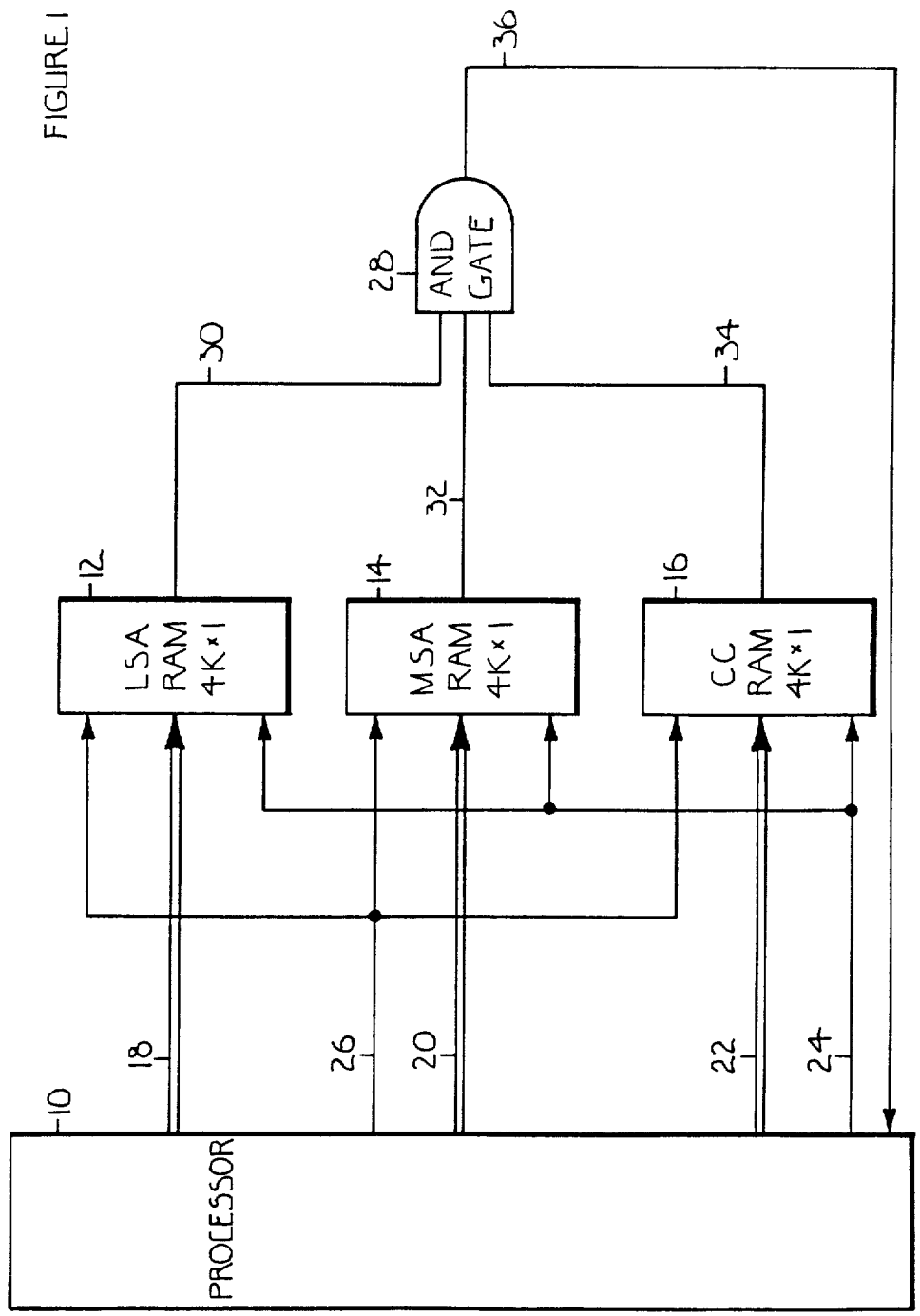

RAM BASED MULTIPLE BREAKPOINT LOGIC

BACKGROUND OF THE INVENTION

The present invention relates to the field of computer systems. Computer systems require the use of breakpoints to perform various debug and diagnostic functions. A breakpoint is bit pattern that is a particular state to be recognized in a computer system. A breakpoint signal is presented thereby signaling various processing units that the state presently exists. The breakpoint logic circuit is a valuable tool when trying to determine if a particular condition exists at a particular point when an operator desires to examine other components at that point so as to aid the debug and diagnostic functions.

Typical computer systems or peripheral debug diagnostic systems, for example, logic analyzers, implement breakpoints by using individual registers. A register is a memory element storing a plurality of bits. Each bit in the register can be a logical zero or a logical one, as is common in digital computer systems. The breakpoint is defined by a bit pattern of logical zeros and logical ones, called a breakpoint code, which is stored in the register. The outputs of the register are typically connected to a comparator which compares the present state of the register, that is, the set breakpoint, and the actual conditions existing on address lines or various other control lines. When the contents of the breakpoint registers equal the signals of the address or control lines, the comparator presents a signal which represents that the register and the address and control lines are equal, that is, the breakpoint has been recognized. The signal typically interrupts a computer system or enables a peripheral diagnostic system. This breakpoint can enable the halting or termination of the processing performed by a computer system. Alternatively, it may stop or start a peripheral diagnostic system capable of capturing some portion of the internal state of the computer system.

This termination on capture allows a computer operator to then scrutinize various contents of the computer system to determine if the computer system is in a proper state at the time of recognition, that is, at the breakpoint.

Thus, typical implementations of breakpoint logic circuitry have been via the use of registers and comparators. One of the disadvantages of this implementation is that there is only one breakpoint address that can be loaded into one of the registers at any one time. Thus, for each breakpoint desired, there needs to be an individual breakpoint register, its corresponding comparator and their corresponding interconnection lines. Thus, to implement a capability of a plurality of breakpoints requires a plurality of breakpoint registers, comparators and interconnecting lines. It should now become apparent that as the number of breakpoints desired increases, so does the complexity of the hardware. This disadvantageously increases the cost of the breakpoint hardware.

It is also an object of the present invention to reduce the hardware cost of a single breakpoint.

It is therefore an object of the present invention to provide an increase in the number of possible breakpoints without the corresponding increase in hardware cost and complexity.

SUMMARY OF THE INVENTION

The present invention uses random access memory (RAMs) to store a plurality of breakpoint identification data signals. The contents of the RAMs determine if the state of particular address and control lines equal a breakpoint. These RAMs can be written into by a processing module. In the simplest embodiment of the present invention, the RAMs may be configured with the single bit output of each RAM being connected to an AND gate. The output of the AND gate signals a breakpoint when the outputs of all of the RAMs are a logical one, that is, the bits addressed have all been previously set, thereby referencing the occurrence for breakpoint.

There is but one AND gate required to perform the equivalent compare function of the prior art. The number of inputs of the AND gate is determined by the number of RAMs. Thus, a single AND gate can replace the plurality of comparators required by the prior art. This advantageously decreases the hardware cost of the breakpoint logic. Each RAM component can handle more inputs than a similarly sized register component. This decreases the cost of the hardware breakpoint logic. Further, a single set of RAMs can provide a large number of breakpoints without disadvantageously increasing the cost of the breakpoint hardware.

The aforementioned and other advantages of the present invention will become apparent from this description of a preferred embodiment, drawings and appended claims.

BRIEF DESCRIPTION OF THE DRAWINGS

FIG. 1 depicts a processor connected to breakpoint logic hardware according to one embodiment of the present invention.

DETAILED DESCRIPTION OF THE INVENTION

Referring to FIG. 1, a processor 10 for which the present invention is to be utilized is shown connected to memory means for storing breakpoint identification data at selected data storage locations. The memory means can be embodied as a LSA (least significant address) RAM 12 and a MSA (most significant address) RAM 14 and a CC (control code) RAM 16 by a LSA bus 18. The memory means includes addressing means for reading out data stored in the memory means. The present invention also includes means for presenting address input signals to the addressing means, which can be embodied as a MSA bus 20 and a CC bus, respectively. The CC bus may be comprised of signals indicating such things as memory read, memory write and other functions which are commonly used to qualify breakpoints. The CC bus may also contain a portion of the memory address. The RAMs 12, 14 and 16 may be, for example 4K (four thousand ninety-six bit) by one bit array RAMs with a single output although those skilled in the art will recognize that the invention is independent of memory size. The RAMs 12, 14 and 16 each present an output bit addressed by the corresponding bus 18, 20 and 22, respectively.

The addressing means for reading out data includes in processor 10 a read control circuit which inhibits the generation of a write strobe signal on write strobe line 24 at the time the read address signals are presented. The RAMs 12, 14 and 16 are in a normally read mode, in that the bit addressed on the respective busses, 18, 20 and 22 is presented at the RAM output unless a write strobe signal is presented by the processor 10 on the write strobe line 24.

Data writing means is used for enabling the memory means to store breakpoint identification data at an accessed data storage location. Data writing means includes in processor 10 a bit write circuit for providing an active bit signal on data bit line 26. To perform a write, the processor 10 presents a logical one or a logical zero data bit signal on a data bit line 26, while an active write strobe signal is presented on line 24.

The memory means includes output means responsive to data read from the memory means. The output means generates a breakpoint recognition output signal when the readout data contains a breakpoint identification data signal. An embodiment of output means is shown in the figure as an AND gate 28.

The RAMs 12, 14 and 16 are connected to the AND gate 28. The LSA RAM 12 presents an LSA bit signal on an LSA bit line 30. The MSA RAM 14 presents a MSA bit signal on the MSA bit line 32. The CC RAM 16 presents a CC bit signal on a CC bit line 34. Thus, the outputs of RAM 12, 14 and 16 are presented on line 30, 32 and 34, respectively. The lines 30, 32 and 34 are the inputs to the AND gate 28. The AND gate 28 presents a breakpoint interrupt signal on a breakpoint interrupt line 36 which is connected to the processor 10.

Data processor means which can be embodied as processor 10 writes a breakpoint identification data signal into the RAMs 12, 14 and 16 by presenting the breakpoint code as an address on lines 18, 20 and 22, and a data one bit on line 26 while presenting an active write strobe signal on line 24. This active strobe signal causes the writing of a ones into the corresponding bit locations of the addresses on busses 18, 20 and 22. Thereafter, whenever that same address is presented on lines 18, 20 and 22, the corresponding outputs on lines 30, 32 and 34 are all true causing the AND gate 38 to present an active signal on line 36 thereby signaling the recognition of a breakpoint. This breakpoint recognition is intended to interrupt the processor so as to enable diagnostic and debug activities. It shold now become apparent that by the use of three conventional components, for example, AD-2147-35 RAMs by Advanced Micro Devices, Inc., and a conventional three input AND gate, the present preferred embodiment enables multiple breakpoints. Those skilled in the art will, of course, realize that if a single RAM component is used, there is no need to employ an AND gate and that the output line of the RAM can directly signal the breakpoints.

Those skilled in the art will, also recognize that the breakpoint active indication could be implemented by use of logical zeros and an OR gate used in place of an AND gate. Thus, the invention is not limited to the particular embodiment described.

The least significant address and most significant address asserted on lines 18 and 20, respectively, are the addresses used to access the memory located in a computer system. The control code signals on lines 22 may represent various types of memory accesses, for example, data read, data write, op code fetch, cache flush, and cache fill. These control codes provide the system operator with the flexibility to determine not only if a particular address is recognized, but also if a corresponding code simultaneously occurs. This improves the flexibility of the debug activity.

The allocation of address lines to the various RAMs determines the classes of breakpoints which can be simultaneously set. For example, suppose that a program is exclusively executed within a single sequent of memory and that the MSA and CC busses are composed exclusively of segment address bits plus control codes. Any number of locations in the program can be breakpointed by setting appropriate location in the LSA.

On the other hand, assume the processor 10 establishes the breakpoint [X, Y, Z] (addresses to RAMs 12, 14, 16 respectively) by setting their corresponding bits in the RAMs 12, 14 and 16. And, assume the processor 10 establishes a second breakpoint address [A, B, C] by setting the corresponding bits in RAMs 12, 14 and 16. In addition to recognizing breakpoints at [A, B, C] and [X, Y, Z], "spurious" breakpoints will also be recognized at [A, B, Z], [A, Y, C], [A, Y, Z], [X, B, C], [X, B, Z] and [X, Y, C].

Note that if A=X and B=Y, then the eight choices above represent only two unique breakpoints. In many cases, address lines to the RAMs can be selected such that breakpoints which are allowed to be set simultaneously differ in addresses presented to only a single RAM.

In cases where address lines cannot be connected to present the desired flexibility, it may be possible for the system to continue automatically if one of the spurious breakpoints is accessed. The system would keep a table of the desired breakpoint codes in some portion of its memory. Whenever a breakpoint is hit, the microcode in the processor is automatically vectored to the code which handles breakpoints. This code scans through the list of desired breakpoint codes comparing values against the actual address reached. If the address is found to be from a spurious breakpoint, execution is resumed. Otherwise the normal breakpoint interrupt is taken.

Those skilled in the art will recognize that RAMs having multiple bit outputs could be used. The multiple bits could be a direct code identifying particular breakpoints or could be used as a vector into another RAM etc., which could perform that function.

I claim:

1. A breakpoint recognition circuit comprising:
   a. a plurality of memory means for storing breakpoint identification data, including addressing means for reading out data stored in said memory means in response to address input signals;
   b. logic means, responsive to breakpoint identification data read from said plurality of memory means, for generating a probable breakpoint recognition signal when data read from said plurality of memory means contains breakpoint identification data; and
   c. processor means for presenting address input signals, including breakpoint codes, to said addressing means, and, responsive to said probable breakpoint recognition signal, for comparing said address input signals against a list of actual breakpoints, and for generating an actual breakpoint recognition output signal when said address input signals are present in said list of actual breakpoints.

2. The breakpoint recognition circuit in claim 1 wherein said processor means includes means for interrupting said processor means in response to said actual breakpoint recognition output signal.

3. The breakpoint recognition circuit in claim 1 wherein one of said memory means comprises a random access memory responsive to a least significant address input code signal.

4. The breakpoint recognition circuit in claim 1 wherein one of said memory means comprises a random access memory responsive to a most significant address input code signal.

5. The breakpoint recognition circuit in claim 1 wherein one of said memory means comprises a random access memory responsive to a control code input code signal.

6. The breakpoint recognition circuit in claim 1 wherein
said plurality of memory means comprises a plurality of random access memories responsive to a least significant address input code signal, a most significant address input code signal, and a control code input code signal; and
said logic means comprises a coincidence logic gate having inputs connected to the output of said plurality of random access memories.

7. A method for recognizing multiple, discrete, non-contiguous, breakpoint signals in a data processing system including a plurality of memory devices including the steps of:

a. storing breakpoint identification data at selected data storage locations in said memory devices;
b. presenting to said memory devices address input signals including breakpoint codes to access data storage locations in said memory devices;
c. reading out data stored at an accessed data storage location in said memory devices in response to said address input signals;
d. generating a probable breakpoint recognition output signal when the data read from said memory devices contains breakpoint identification data;
e. comparing said address input signals to a list of actual breakpoints in response to said probable breakpoint recognition output signal; and
f. generating an actual breakpoint recognition output signal when said address input signals are in said list of actual breakpoints.

* * * * *